United States Patent [19]
Ashworth

[11] Patent Number: 6,072,592
[45] Date of Patent: Jun. 6, 2000

[54] METHOD AND APPARATUS FOR PREPARING COLOR SCREENS IN A HALFTONE IMAGE

[75] Inventor: William Frederick Ashworth, Wellington, New Zealand

[73] Assignee: Megadot Systems Limited, Wellington, New Zealand

[21] Appl. No.: 08/954,262

[22] Filed: Oct. 20, 1997

Related U.S. Application Data

[63] Continuation-in-part of application No. 08/503,624, Jul. 18, 1995, Pat. No. 5,680,222, which is a continuation of application No. 07/928,424, Aug. 13, 1992, abandoned.

[30] Foreign Application Priority Data

| Aug. 13, 1991 | [NZ] | New Zealand | 239389 |
| Nov. 18, 1991 | [NZ] | New Zealand | 240636 |
| Dec. 13, 1991 | [NZ] | New Zealand | 240979 |
| May 1, 1992 | [NZ] | New Zealand | 242583 |

[51] Int. Cl.[7] .............. B41B 15/00; B41J 15/00
[52] U.S. Cl. .............. 358/1.9; 358/454; 358/456; 358/459; 358/534; 358/536
[58] Field of Search .............. 395/109; 358/454, 358/455, 456, 457, 458, 459, 534, 535, 536, 1.9

[56] References Cited

U.S. PATENT DOCUMENTS

| 3,725,574 | 4/1973 | Gast .............. 346/108 X |
| 4,084,183 | 4/1978 | Keller et al. .............. 358/298 |
| 4,149,183 | 4/1979 | Pellar et al. .............. 358/75 |
| 4,185,304 | 1/1980 | Holladay .............. 358/298 |
| 4,196,451 | 4/1980 | Pellar .............. 358/283 |
| 4,680,645 | 7/1987 | Dispoto et al. .............. 358/298 |
| 4,894,726 | 1/1990 | Steinhardt et al. .............. 358/298 |
| 4,916,545 | 4/1990 | Granger .............. 358/456 |
| 4,918,622 | 4/1990 | Granger et al. .............. 358/298 X |
| 5,233,441 | 8/1993 | Hamilton .............. 358/459 |
| 5,239,391 | 8/1993 | Hamilton .............. 358/459 |
| 5,253,084 | 10/1993 | Rylander .............. 358/456 |

FOREIGN PATENT DOCUMENTS

| 370271 | 5/1990 | European Pat. Off. . |
| 20 25 609 | 12/1970 | Germany . |
| 29 17 242 | 11/1980 | Germany . |
| WO90/06034 | 5/1990 | WIPO . |
| WO90/10991 | 9/1990 | WIPO . |

OTHER PUBLICATIONS

K. Haller, Fogra Research Report 6.029 (1982). (Including excerpts translated into English of pp. 3, 9, 14, 18, 19, 20, 25, 26 and 27.)

Hell GMBH Dot Shapes, 6 pages (pre–1991).

C. Eliezer, "Color Screening: How to Judge the Results," *The Seybold Report on Publishing Systems*, vol. 21, No. 11, pp. 3–11 (Feb. 29, 1992).

C. Eliezer, "Color Screening Technology: A Tutorial on the Basic Issues," *The Seybold Report on Desktop Publishing*, vol. 6, No. 2, pp. 3–25 (Oct. 1991).

*Desktop to Press*, No. 9, 13 pages (Feb. 1992).

Primary Examiner—Thomas D. Lee
Attorney, Agent, or Firm—Sterne, Kessler, Goldstein & Fox, PLLC

[57] ABSTRACT

The dot patterns can be used to reduce dot gain and moiré effects in halftone images involve printing areas that have inwardly curved edges and variable elongation. Colored images having screens that use these patterns can be printed with the screens at 45° relative angular separations. Alternatively the dot patterns can be regarded as reversed variable oval patterns with varying elongation of the generally oval shaped non-printing areas.

18 Claims, 10 Drawing Sheets

METHOD AND APPARATUS FOR PREPARING COLOR SCREENS IN A HALFTONE IMAGE

RELATED APPLICATIONS

This is a continuation-in-part application of U.S. application Ser. No. 08/503,624, filed Jul. 18, 1995, now U.S. Pat. No. 5,680,222, which is an continuation of application Ser. No. 07/928,424, filed Aug. 13, 1992, now abandoned.

BACKGROUND OF THE INVENTION

1. Field of the Invention

This invention relates to printing processes and in particular to dot patterns used when preparing halftone images. These patterns include shapes which reduce the perceptibility of certain moiré effects and various tone jumps which are often seen.

2. Description of the Prior Art

In most printing processes it is only possible to apply a single tone of each available ink color to the print media. Tone variation is then achieved by breaking up each image into fine dots of varying size on a halftone screen grid. Color variation is normally achieved by superimposing screens of the primary colors cyan, magenta and yellow, plus black for definition. Ideally human vision integrates the dots over a well prepared image into an accurate impression of the original scene. A final image will almost always include a number of compromises between practical limitations and defects in the printing process, and what can actually be perceived by the human eye and brain.

Round dots at 45° to vertical are least perceptible for a given spacing or screen ruling (or dot frequency), and single color images are conventionally printed in this manner. Other dot shapes or combinations of shapes such as square and "elliptical" (diamond shape) are sometimes used, but all have generally straight or outwardly curved edges around the fill length of their perimeters. The dots are usually created in square cells forming rows spaced at between about 30/cm for newsprint and about 60/cm for higher quality images. In light tones the dots remain distinct on a light background provided by the print medium, but merge in darker tones which then appear as light dots on a dark background. The printed and non-printed areas of an image therefore appear to reverse from dots to background and background to dots respectively as tone darkens.

When printing color images undesirable moiré effects in the form of large and small scale patterns are often seen due to periodic alignment of the dots as a whole and of their edges. The large scale patterns are typically bands which intersect to form squares on the order of tens or more dots along each side. This effect is largely removed by suitable relative rotation of the color screens such as by cyan 15°, magenta 45°, yellow 90° and black 75° anticlockwise from horizontal. Complex mathematical procedures are often used to establish suitable angles. Placing the screens without relative rotation or offset can cause color shifts in an image where colors of differing opacity, particularly black and yellow, overlap consistently over a large region. Subtle color shifts may occur in any case due to mis-registration of the screens during their superposition. The small scale patterns of moiré effects are typically rosettes on the order of a few dots width, which cause perceptible speckling of otherwise uniformly colored areas. This effect has proved more difficult to remove.

A further problem often arises in printing halftone images, known as dot gain, amid tones where adjacent dots are so sufficiently large as to become linked by imprecision in their reproduction. For example in lithography, which includes offset printing, a greasy ink is confined to printing areas of an image plate by dampening the surrounding non-printing areas with water. Unfortunately surface tension at the ink/water interfaces can cause or enhance bridging between closely spaced printing areas creating sudden tone jumps. Ink absorption on poor quality print paper can also lead to bridging. Round and square dots formed in square cells naturally meet their nearest neighbors at 78% and 50% printing area densities, respectively. Dot gain causes bridging at slightly higher densities creating discontinuities in regions of an intended smoothly varying tone. This effect is also difficult to remove completely.

Preparation of halftone images is largely carried out using computer controlled devices such as scanners and imagesetters. A photograph or other artwork to be reproduced is scanned and the original scene is stored in electronic memory or output directly. The images can be manipulated and/or combined with text before a printing medium such as a film or plate is produced. It is normally only in the final output stages that an image is converted to halftone dot screens. The manipulations are complex software operations which may be varied to suit particular images. Similar software is used in other electronic printing and imagesetting processes such as desktop publishing. Precise control of the dot patterns is necessary in preparing acceptable images, and the computations required for high quality images are often extensive and time consuming. For example, software methods for reducing moiré effects are disclosed in U.S. Pat. No. 4,084,183 (congruent screens), U.S. Pat. No. 4,894,726 (quasi periodic screens), EP 370271 (elongated conventional dots), WO 90/10991 (rectilinear screen transposition) and WO 90/06304 (pseudo random variation of dot shapes). Some images are still prepared using conventional photomechanical equipment such as contact screens. Good summaries of known dot patterns, their various problems and moiré effects are to be found in *Colour Screening Technology; A Tutorial on the Basic Issues*, The Seybold Report on Desktop Publishing, Vol. 6, No. 2, October 1991, Seybold Publications, Inc., PA, USA, and *Desktop To Press*, Issue 9, February 1992, Peter Fink Communications Inc., CA, USA.

SUMMARY OF THE INVENTION

It is an object of the present invention to provide an alternative dot pattern which can be used to reduce rosette moiré, dot gain and tone jump effects in halftone images.

A halftone image having a dot pattern according to the invention is created by printing dots having inwardly curved edges. In light tones the dots may resemble pin cushions having pronounced cusps. In dark tones the dots are effectively merged to create non-printing dots which may be oval shaped. As tone varies from light to dark, the pin cushions are increasingly elongated along one direction and meet their nearest neighbors in two distinct stages, first in the direction of elongation, and then in a direction substantially perpendicular to it. The dot screen is typically formed from a square lattice so there are typically four nearest neighbors symmetrically placed at equal distances. As tone continues to darken after the dots have joined, the elongation is gradually decreased so that the oval shaped non-printing dots approach round dots. The pattern may also be considered overall as a reversed elliptical dot pattern in which the ellipses vary from round to a maximum ellipticity and back to round across the full range of tones. When a number of screens are superimposed the inwardly curved edges of the printing areas do not align so readily to form perceptible rosettes as do conventional dots. Further, the elongation can be varied so that dot gain occurs in tones where its perceptibility also is minimized.

At the present time as this specification is prepared, the optimum uses and the ramifications of the invention have not been fully explored. In preparing colored images it has been found that the primary color and black screens are best placed at approximately 45° separations from each other. For example cyan 45°, magenta 135°, yellow 90° and black 0°. Screens which are separated by 90° may generally be regarded alternatively as being at 0° so that in this example there are essentially only two angles for computation of dot patterns, 0° and 45°. This represents a considerable computational simplification over conventional screen angles.

The cyan and magenta screens will normally have a deliberate offset or mis-registration from each other to avoid possible color shifts. Yellow and black screens can also be offset from each other, and can be printed with little or no elongation of the dots. The yellow and/or black screen rulings can also be increased and/or decreased relative to cyan and magenta. Final determination of these possibilities awaits full software implementation of the invention and will depend on particular images.

BRIEF DESCRIPTION OF THE DRAWINGS

Examples of the invention will be described with reference to the drawings of which.

DETAILED DESCRIPTION OF THE PREFERRED EMBODIMENTS

Referring to the accompanying figures it will be seen that the dot patterns are magnified about 10 to 100 times in black and white for purposes of their description. The visual effects resulting from integration by the human eye over a halftone image at normal scales are not evident but should be appreciated by a skilled reader. Particularly the improvements to be obtained in color images by inwards curvature of printing dot edges in light to middle tones and to be obtained in single color images by dot elongation will be appreciated.

Figure 9:
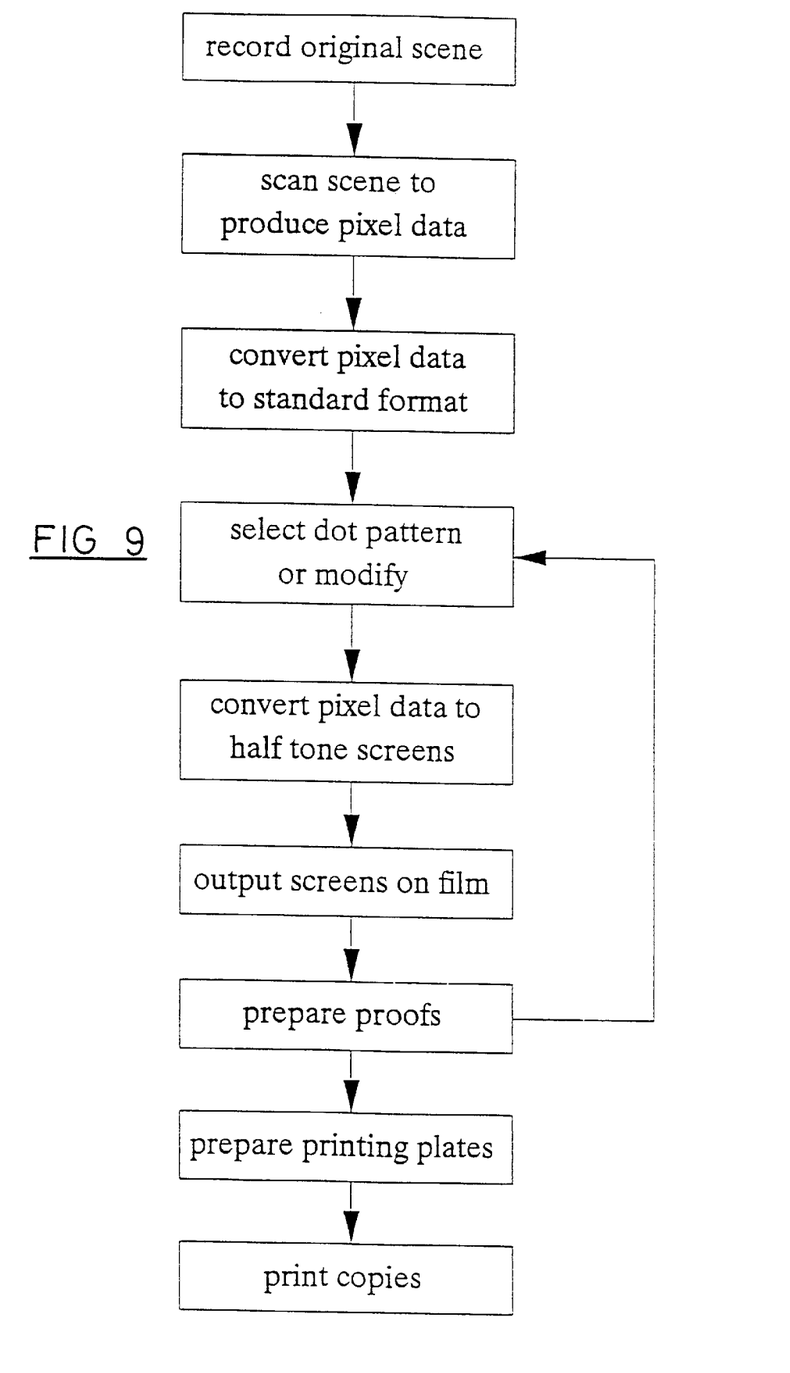
FIG. 9 is a flowchart indicating a general process in which the invention can be implemented.

The various forms of computer hardware and software used to implement dot patterns according to the invention will also be known to the skilled reader, or at least will be available for consideration through the references given above, particularly the Seybold and Fink articles. For example, a range of desktop publishing and high end scanner equipment and software is available through suppliers such as Adobe, Agfa, Crosfield, Linotype-Hell and Scitex. As new patterns are developed the hardware and/or software can be correspondingly upgraded. A typical process of preparing a halftone image, particularly a colored image as implemented on their equipment, is outlined in the flowchart of FIG. 9.

In general terms, a scene is electronically scanned from a film or other artwork to be printed, or recorded in some other digital process, and the data obtained is stored as pixel based color and intensity information. The pixels are generally aligned with the vertical and horizontal directions of movement of the scanner. The data is then processed into a standardized format such as known under the trade mark POSTSCRIPT and from there into up to four halftone screens which represent the primary colors and black as required. These screens are created from the pixel information by various raster image processor programs which calculate the dot shapes, dot frequencies and screen rotation angles. An operator normally has a range of dot patterns available through software installed on the equipment. The operator selects appropriate shapes, spacings and angles in reaching an acceptable image during proofing. In traditional printing operations each screen is then output individually, to create up to four films or plates which are used to print multiple copies of the final black and white or colored image. This part of the process is known as imagesetting in the case of desktop publishing and as scanner output in the case of "high end" systems. In other computer-based operations, such as ink jet or laser printing, it is possible to output a colored image directly.

Figure 1A:
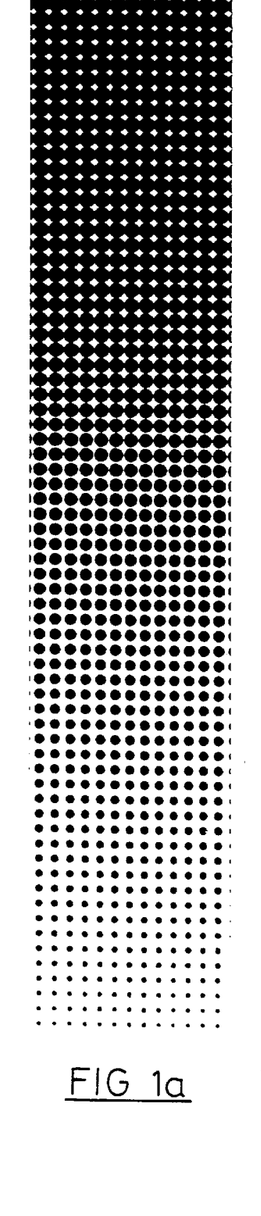
FIGS. 1a, 1b and 1c show coarse conventional round, square and elliptical dot patterns respectively, varying uniformly between light and dark tones.
Figure 1B:
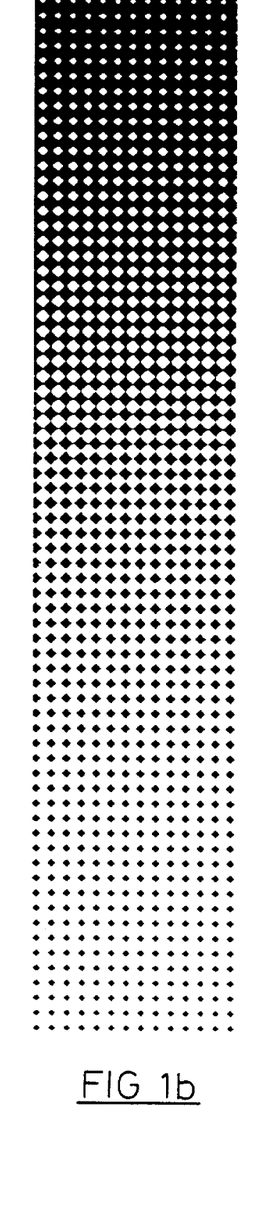
Figure 1C:
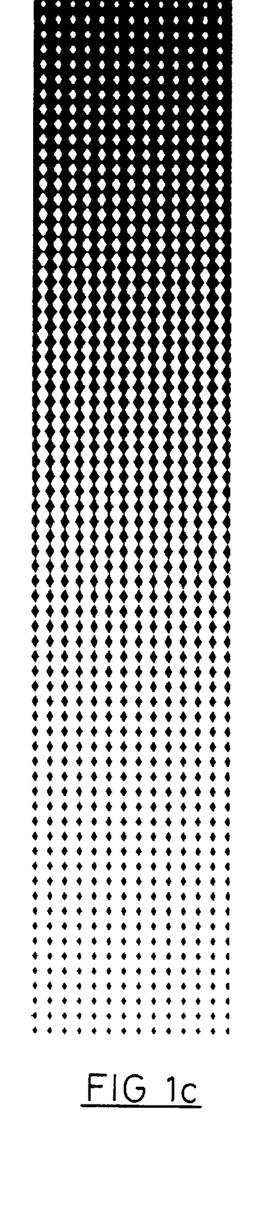

FIGS. 1a, 1b and 1c show conventional round, square and "elliptical" dot patterns respectively, varying smoothly in size from about 10% print area density in light tones to about 90% area density in dark tones. Round dots have outwardly curved edges by definition whereas square or diamond shaped dots have flat edges between four points. The square patterns are invertible in that the printed areas in light tones have similar shapes to the non-printed areas in dark tones and vice versa.

Figure 2:
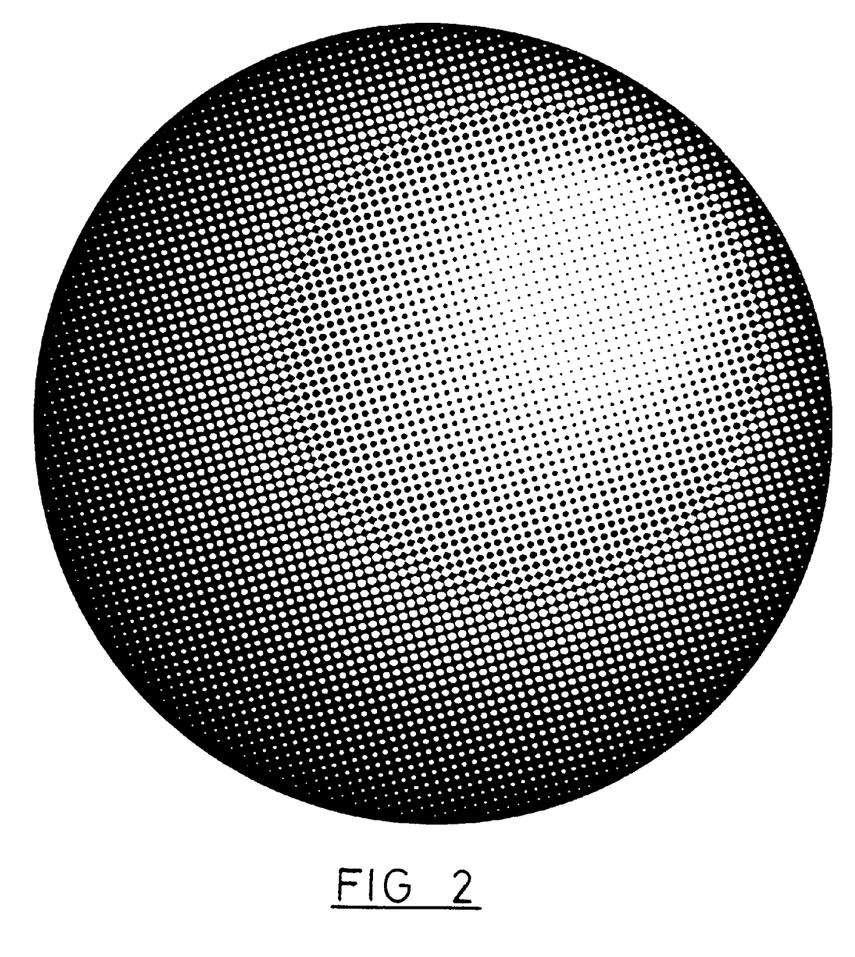
FIG. 2 is an illuminated globe image using a conventional variable round dot pattern.

FIG. 2 demonstrates a more complicated dot pattern in which conventional round dots in light tones become square dots in middle tones with reversal of the round dots in dark tones. This is often referred to as the Euclidean dot pattern. The edge curvature of printed areas correspondingly changes from outward to flat to inward respectively. Moiré effects do not arise in FIGS. 1 and 2 as only a single screen is present in each case. Dot gain is not apparent due to the magnification.

Figure 3:
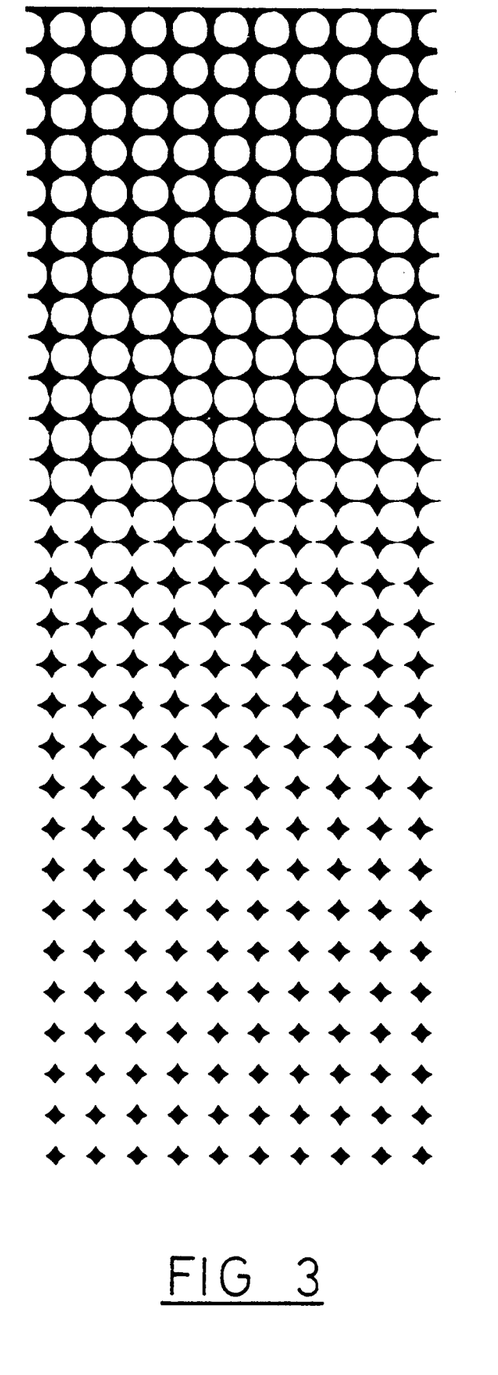
FIG. 3 shows reversal of a coarse conventional round dot pattern to produce printing areas having inwardly curved edges.

FIG. 3 shows a reversed round dot pattern varying uniformly from light to dark tones. The dots in light tones have inwardly curved edges between cusps distributed on two planes of mirror symmetry. Their points could perhaps be flattened or rounded as desired. Each dot meets its four nearest neighbors simultaneously at around 22% area density. Otherwise the inwards curvature extends along substantially the fill length of all printed areas. The non-printed areas have corresponding outwardly curved edges and separate to appear as round dots in the dark tones. Overall the pattern is seen to be effectively a reversal or negative of the conventional round dot pattern in FIG. 1a throughout the entire range of tones, and in this respect can be considered a pattern of light round dots on a dark printed background. By virtue of this reversal of all print area edges are circles or circular arcs but could be other smooth curves as desired, or as required to link with the end points. Also the dots need not be fourfold symmetrical as shown. Rosette moiré effects in colored images can be reduced by printing dot patterns having inwardly curved edges as will be evident from later figures in which two screens are superimposed. Tone jumps due to dot gain remain a problem however, as with the conventional round dot pattern.

Figure 4A:
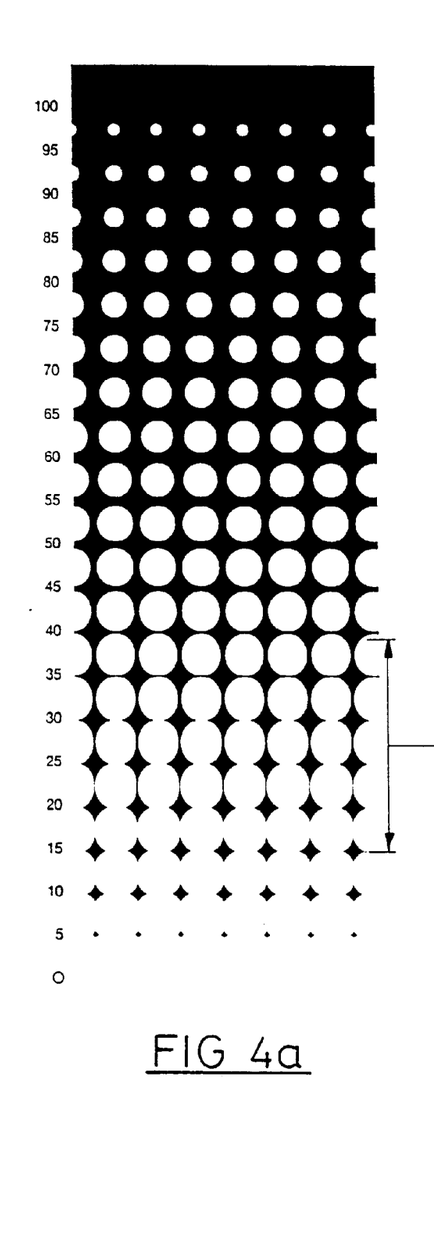
FIGS. 4a and 4b show reversal of a variable oval dot pattern in which the dots vary from round to oval and back to round according to the invention.
Figure 4B:
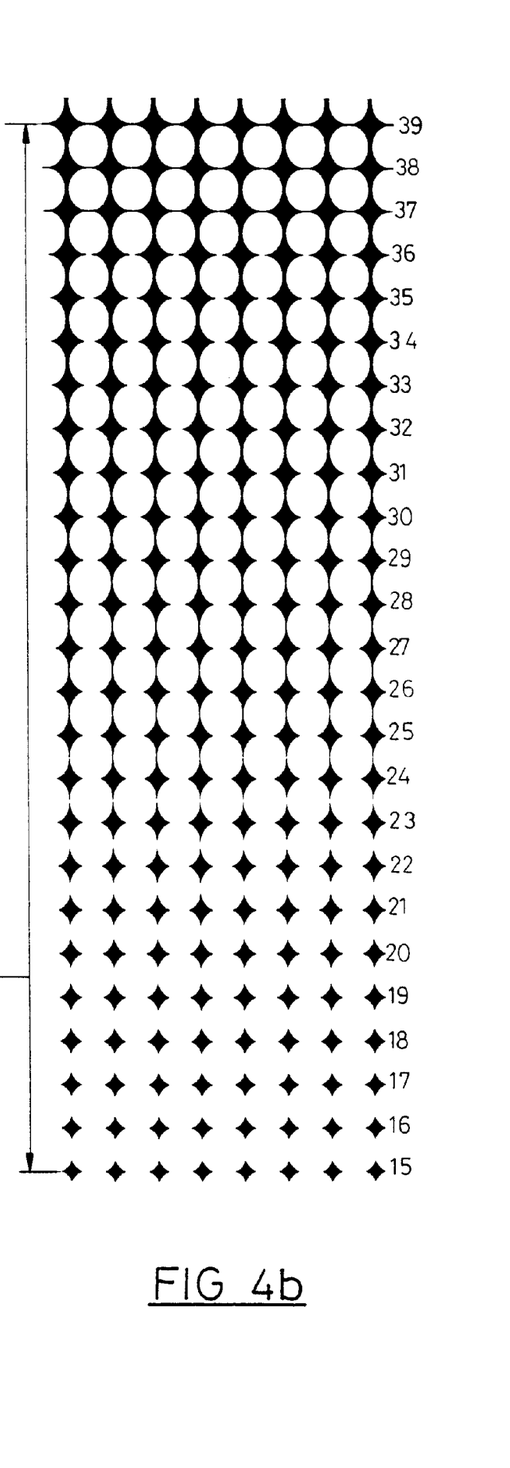

FIGS. 4a and 4b show a reversed variable oval dot pattern according to the invention. In this form the generally pin cushion shaped dots are elongated along a plane of mirror symmetry in light quarter to middle tones, so that nearest neighbors meet first vertically along the direction of tone darkening and then second horizontally in the corresponding perpendicular direction. Each dot meets two opposing pairs in two distinct stages of around 22% and 36% area density. This pattern is seen to be effectively a reversal or negative of a round dot pattern in which the dots become oval in middle tones. FIG. 4a shows a full range of tone from 0% to 100% while FIG. 4b shows more detail of the fourfold/twofold or alternatively the round/oval variation from about 15% to 39% area density. Rosette moiré effects can be reduced as with the pattern of FIG. 3, but now by controlling dot elongation the perceptibility of any tone jumps can also be reduced by splitting dot gain into two less obvious stages which in turn can be shifted among a range of tones.

Figures 5A, 5B:
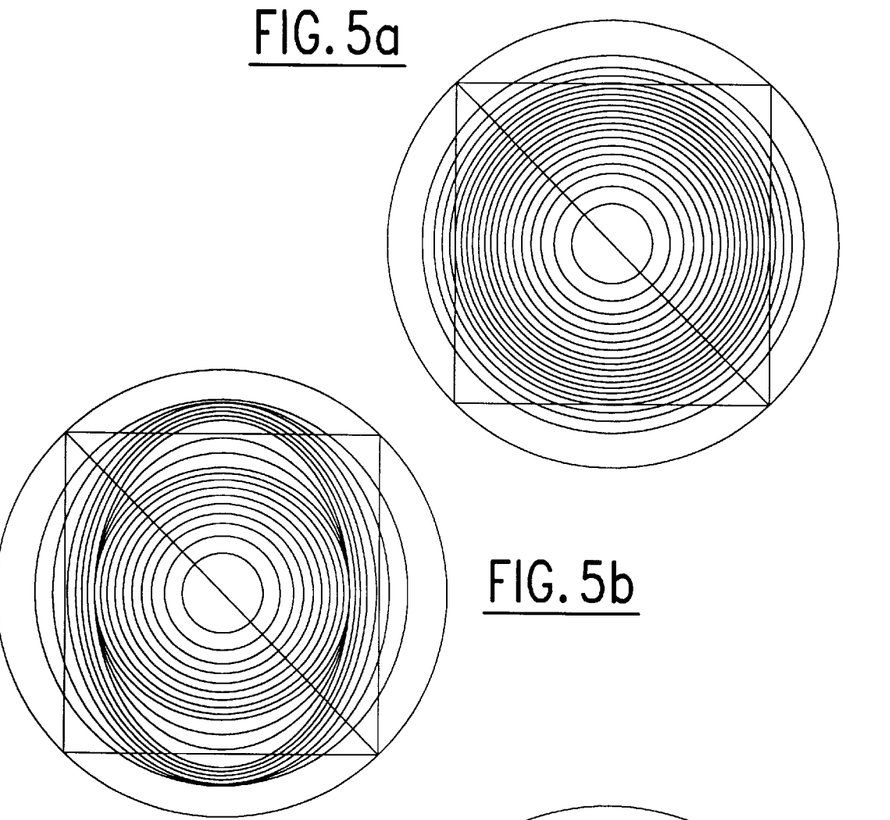
FIGS. 5a, 5b and 5c show example variable oval dot outlines superimposed upon common centers according to the invention.
Figure 5C:
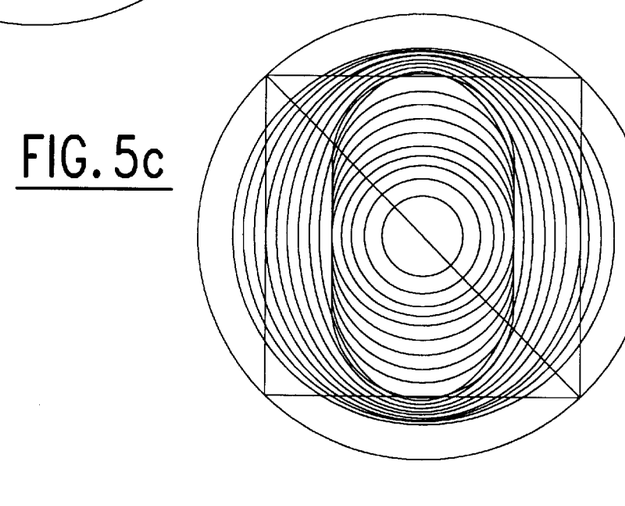

FIGS. 5a, 5b and 5c show contour patterns that can be used in manual preparation of the threshold matrices mentioned on pages 15 and 16 of the Seybold report above, and as described in Table 1 described below. The contour lines will determine the dot shapes at various tone densities, and are not necessarily mathematical ellipses but may take any suitable oval or approximately similar form. FIG. 5a shows the gentle round-oval-round variation of FIGS. 4a and 4b. FIGS. 5b and 5c show more severe distortions resulting in greater separation of the dot gain stages.

Figure 6A:
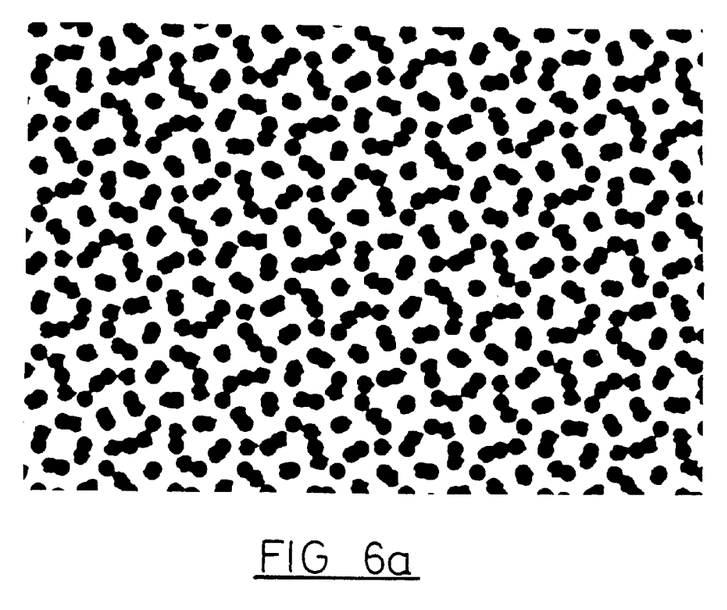
FIGS. 6a and 6b show respectively two conventional round dot screens overlapping at 30° and two reversed dot screens according to the invention overlapping at 90°.
Figure 6B:
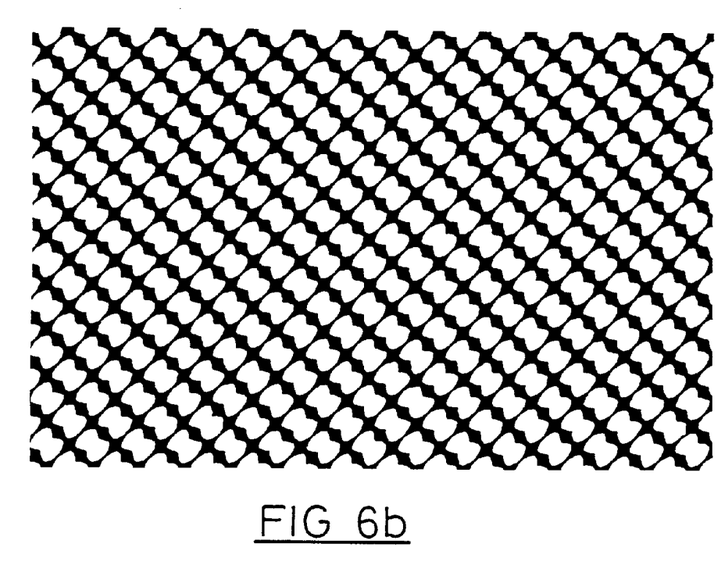

FIGS. 6a and 6b are an illustration of the reduction in rosette moiré effect which can be achieved according to the present invention. FIG. 6a shows rosettes created by superimposing two conventional round dot screens at 30°, as is common with cyan and magenta in colored images. FIG. 6b shows a smoother variation of similar tones created by superimposing two reversed variable oval dot screens at 90° according to the invention. Preparing colored images using all four possible screens is less straightforward.

It has been found that the primary color screens are apparently best placed at 45° angular separations, such as cyan 45°, magenta 135° and yellow 90°, with black placed at 0° or 90°. Further, that not every screen need be printed according to the invention. For example, at least cyan and magenta should use elongated dots of the reversed variable oval dot pattern, while yellow can use only the reversed round dot pattern. Black may only need the reversed round dot pattern, or can even give satisfactory images using the conventional round dot pattern itself.

It has also been found that black dots are often not necessary in preparing a well defined colored image. For example, the primary color screens can be used alone at the angles and with the patterns mentioned above.

It is also generally required that the cyan and magenta screens should be offset from each other to avoid possible color shifts. The offset should be about half a cell parallel with either of the screen directions, for best results in view of the accidental offsets which often occur during printing.

Yellow and black screens should also sometimes be offset to avoid color shifts. The nature of these offsets has yet to be fully explored but will be evident to a skilled reader working on a particular image.

In some images the possibility of color shifts and moiré effects has been reduced with the 45° angles and reversed patterns mentioned above, by decreasing the black screen ruling (increasing the dot frequency) by a factor of about cosine 45° (about 0.71) relative to cyan and magenta. In a smaller number of cases the yellow screen ruling has been correspondingly increased by this factor. Again the nature of these adjustments to the spacings has yet to be fully explored, but will be evident to a skilled reader working on particular images.

Figure 7A:
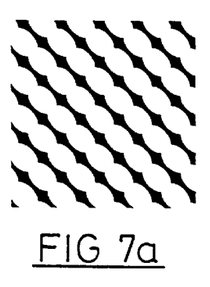
FIGS. 7a to 7i show example dot patterns for various screen combinations according to the invention.
Figure 7B:
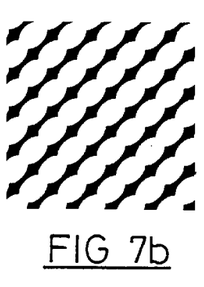
Figure 7C:
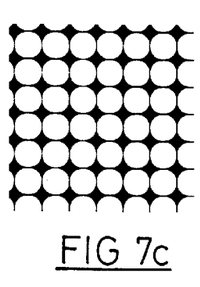
Figure 7D:
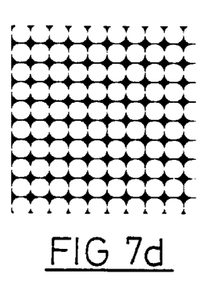
Figure 7E:
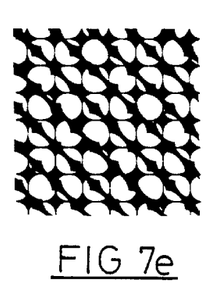
Figure 7F:
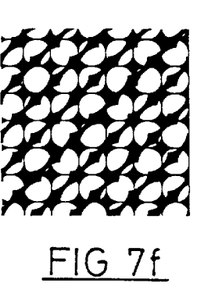
Figure 7G:
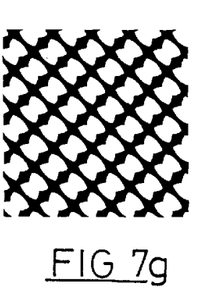
Figure 7H:
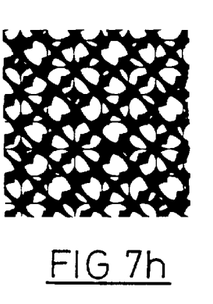
Figure 7I:
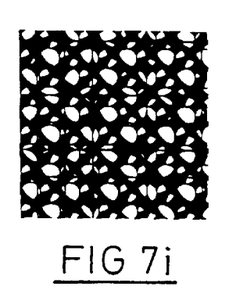

FIGS. 7a to 7i show the dot patterns of a test which has been carried out to date according to the invention. FIGS. 7a to 7d represent individual screens of cyan 135°, magenta 45°, yellow 0° and black 0/90°, all at tone values where the printing and non-printing areas have linked with two or four of their nearest neighbors. Cyan and magenta use the reversed variable oval dot pattern. Yellow and black use simply the reversed round dot pattern. The black screen ruling has been reduced by a factor of about 0.71 relative to the others. FIGS. 7e to 7g show screens superimposed in pairs, namely cyan/yellow, magenta/yellow and cyan/magenta. In FIGS. 7f and 7g the cyan and magenta have been offset by half a cell parallel to their screen directions, which are diagonal on the page as shown. The visible effect is somewhat unrealistic in that yellow normally has substantially less impact on the eye than the darker colors but here all colors must be shown equally in black. FIG. 7h shows the cyan, magenta and yellow screens superimposed. A very slight moiré effect is apparent primarily because the colors must be shown in black as mentioned. FIG. 7i shows the black screen of FIG. 7d superimposed on FIG. 7h. Again there is a slight moiré effect due to the overall black color representation whereas under normal printing circumstances the colors would have different impacts and the final image screen would be virtually moiré free.

Figure 8A:
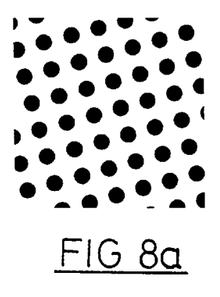
FIGS. 8a to 8i show corresponding conventional round dot patterns for contrast with FIGS. 7a to 7i.
Figure 8B:
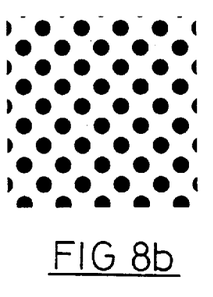
Figure 8C:
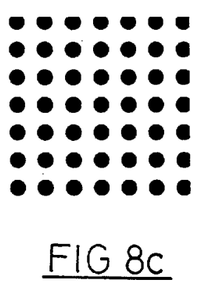
Figure 8D:
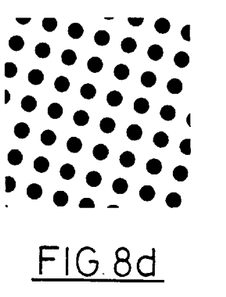
Figure 8E:
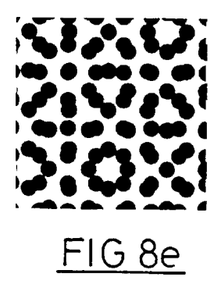
Figure 8F:
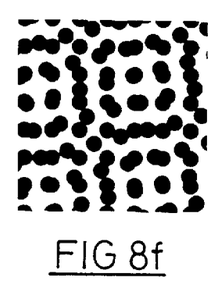
Figure 8G:
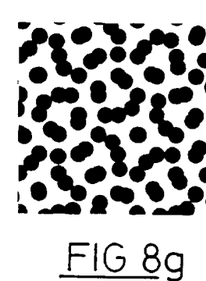
Figure 8H:
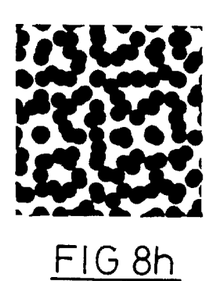
Figure 8I:
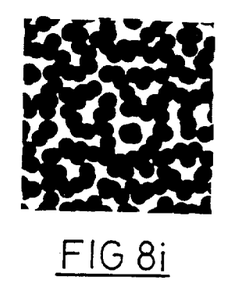

FIGS. 8a to 8i show an attempt to contrast with FIGS. 7a to 7i, the conventional round dot patterns which would typically have been used. FIGS. 8a to 8d represent individual screens of cyan 15°, magenta 45°, yellow 0° and black 75°. FIGS. 8e to 8g show these screens superimposed in pairs, namely cyan/yellow, magenta/yellow and cyan/magenta. FIG. 8h shows the cyan, magenta and yellow screens superimposed. FIG. 8i shows the black screen of FIG. 8d superimposed on FIG. 8h. Both large and small scale moiré effects can be seen in these figures, although the effects are not so apparent as they normally would be in a complete colored image at normal screen rulings. The effects of dot gain are not at all apparent due to the artificial manner in which these figures must be presented.

Figure 10:
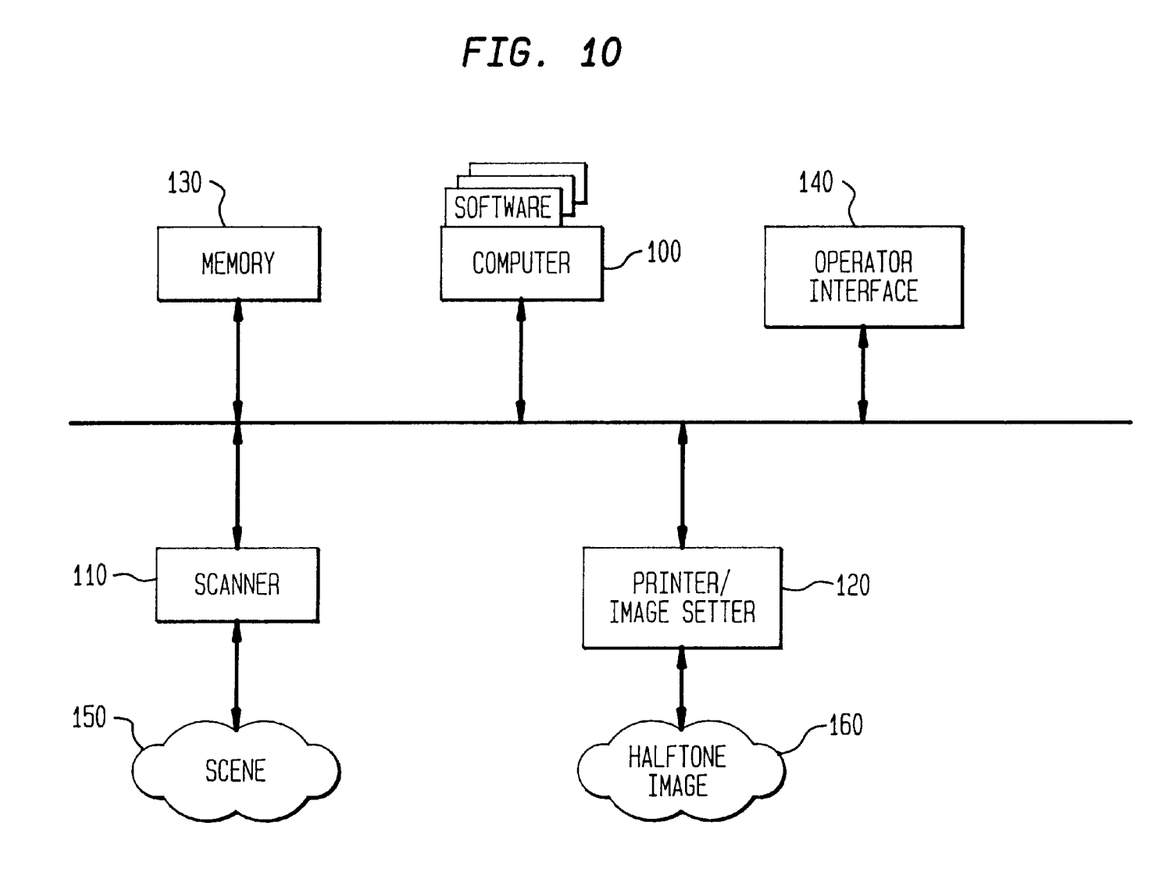
FIG. 10 is an exemplary, high-level block diagram of a computer system according to the present invention.

As noted above, preparation of halftone images is typically carried out using computer controlled devices such as scanners and imagesetters. A photograph or other artwork to be reproduced is scanned and the original scene is stored in electronic memory or directly output. FIG. 10 shows an exemplary high-level block diagram of a high end computer controlled apparatus which can be used by a human operator in implementing the process of FIG. 9. The operator interfaces with the apparatus through a keyboard or other appropriate hardware and software 140. A recorded scene 150 such as a photograph is passed under a scanner 110 to produce pixel data. That data is stored in a memory 130, which is typically a hard disk. A computer processor 100 is then used to select and modify dot patterns based on color and shading information in the pixel data. Halftone screens in primary colors or black are output through a printer/imagesetter 120. The scenes are combined in preparation of a high quality halftone image 160, in accordance with the present invention.

The following is a simple explanation of the process by which half-toning can take place on a computer, or computerized equipment such as an imagesetter. The equipment is known technology, with the present invention relating to variations of dot shape and screen angles implemented on the equipment.

The fundamental operation is the application of a half toning pattern to a continuous tone original image to produce a binary (black or white) image in such a way that the visual effect approximates the continuous tone original image. An identical process is carried out for each primary color or black screen. This process revolves around the threshold matrix: a grid of number or grey levels that specifies the size and shape of each printed dot desired for various levels of grey in the image to be printed.

Table 1 below is one possible threshold matrix to implement a dot shape according to the invention on a 16×16 grid as would be used, for instance, for a 150 lpi screen on a printer operating at 2400 dots per inch.

function (called a spot function) that takes x and y coordinates within the halftone cell and returns a value indicating the "height" of that point. The heights so generated are then sorted by the computer and assigned the numbers 0, 1, 2, 3 . . . as above. Consider an example mathematical function that include $f(x,y)=x$ for a vertical line pattern, $f(x,y)=y$ for a horizontal line pattern, and $f(xy)=\sqrt{(x^2+y^2)}$ for a conventional circular dot screen.

A manual process was used in developing the present invention through the prototype stages described in the provisional and complete specifications. Once the threshold matrix is derived, the actual algorithm used to apply it is simply to consider each cell in a particular halftone screen in turn and compare the number written there against the desired grey level (also expressed as a number from 0 to 255, with 0 being black and 255 being white) in the image to be printed. If the number from the table is larger than the desired grey level, then that pixel is printed as white, otherwise it is printed as black.

This process can be carried out in any of a number of ways: Using photographically, by arranging for light from the desired image to shine through a transparent sheet imprinted in the above pattern, and then onto high-contrast film that will quite suddenly change from transparent to opaque at some fixed level of exposure to light.

TABLE 1

| 253 | 248 | 234 | 197 | 156 | 113 | 103 | 99 | 97 | 102 | 112 | 158 | 196 | 233 | 246 | 252 |
|-----|-----|-----|-----|-----|-----|-----|----|----|-----|-----|-----|-----|-----|-----|-----|
| 249 | 239 | 207 | 170 | 132 | 104 | 85 | 80 | 82 | 86 | 106 | 133 | 169 | 206 | 237 | 245 |
| 242 | 223 | 185 | 145 | 117 | 90 | 78 | 71 | 70 | 76 | 91 | 116 | 144 | 184 | 220 | 243 |
| 228 | 201 | 173 | 142 | 109 | 73 | 62 | 57 | 56 | 63 | 74 | 103 | 141 | 172 | 203 | 231 |
| 225 | 192 | 165 | 138 | 93 | 53 | 51 | 43 | 34 | 45 | 52 | 94 | 137 | 157 | 195 | 227 |
| 217 | 189 | 161 | 131 | 67 | 38 | 29 | 19 | 18 | 24 | 37 | 64 | 130 | 160 | 190 | 218 |
| 212 | 181 | 155 | 124 | 48 | 25 | 13 | 8 | 7 | 14 | 25 | 49 | 126 | 152 | 183 | 213 |
| 209 | 176 | 151 | 120 | 32 | 17 | 5 | 2 | 3 | 4 | 16 | 35 | 122 | 148 | 177 | 210 |
| 211 | 178 | 150 | 123 | 36 | 20 | 9 | 0 | 1 | 11 | 21 | 39 | 121 | 149 | 179 | 208 |
| 214 | 180 | 153 | 125 | 46 | 30 | 15 | 6 | 10 | 12 | 27 | 50 | 127 | 154 | 182 | 215 |
| 216 | 188 | 162 | 128 | 65 | 33 | 28 | 23 | 22 | 31 | 41 | 66 | 129 | 163 | 191 | 219 |
| 224 | 193 | 166 | 139 | 92 | 55 | 47 | 40 | 42 | 44 | 54 | 95 | 136 | 164 | 194 | 226 |
| 230 | 200 | 174 | 140 | 110 | 75 | 60 | 58 | 59 | 61 | 72 | 111 | 143 | 175 | 202 | 229 |
| 241 | 221 | 186 | 146 | 118 | 88 | 77 | 68 | 69 | 79 | 89 | 119 | 147 | 187 | 222 | 240 |
| 247 | 236 | 205 | 168 | 134 | 105 | 87 | 81 | 83 | 84 | 107 | 135 | 171 | 204 | 238 | 244 |
| 254 | 250 | 235 | 198 | 157 | 115 | 101 | 98 | 96 | 100 | 114 | 159 | 199 | 232 | 251 | 255 |

The interpretation of this table is that, starting from a completely black pattern, the first pixels to be whitened are in a roughly circular pattern in the middle. By the time 100 pixels have been whitened, the white area extends fully to the top and bottom of the pattern, but only halfway to the left and right sides (note the sudden jump from values in the mid-30's to more than 120 as you proceed left or right from the middle in the middle rows).

The process of creating a threshold matrix such as the one above comprises of two steps: (1) deciding the desired shape dots, and (2) how the shape should change at various dot sizes. This process will affect the overall look of the printed image, and the exact shape selected will determine various properties of the printed image, such as tone-jump and for multi-color printing, moiré patterns.

Thus, the present invention permits creating the threshold array in a standard fashion. This can be performed manually, or by a mathematical algorithm. The manual process consists of overlaying a grid with "contour lines" such as those shown in FIGS. 5*a*, 5*b*, 5*c* which determine the desired dot shapes at various grey levels (10%, 20%, 30%, etc) and writing down the numbers 0, 1, 2, 3 . . . in the cells enclosed by each contour line in turn, until the entire table is filled in.

The mathematical process, which can be used for sufficiently simple shapes, consists of developing a mathematical Alternatively, a program on a computer workstation can be used. The resulting black and white result stored is on a hard disk, displayed on a TV monitor, or sent as a bitmap to a simple dot matrix, ink jet, laser, or other printer. Another technique would be to program a sophisticated computerized printer. Many printers have several halftone screen patterns build into their software. In order to be useful for the various dot shapes, it must be possible for the user to specify the pattern to be used for half toning.

The most common high-end output devices in the prepress industry today are based on a computer programming language called PostScript, and we have concentrated our efforts on these patterns, though the inventions described in the specification apply equally well to other printing and display devices.

In printers that use Level 2 PostScript, it is possible for the user to directly specify the threshold matrix to be used to the printer, as in this example of one of the prototype shapes (this is the same table as previously shown):

```
10 dict begin
   /Halftone Type 3 def
   /Width 16 def
   /Height 16 def
   /Thresholds 256 string def
[253 248 234 197 156 113 103  99  97 102 112 158 196 233 246 252
 249 239 207 170 132 104  85  80  82  86 106 133 169 206 237 245
 242 223 185 145 117  90  78  71  70  76  91 116 144 184 220 243
 228 201 173 142 109  73  62  57  56  63  74 103 141 172 203 231
 225 192 165 138  93  53  51  43  34  45  52  94 137 157 195 227
 217 189 161 131  67  38  29  19  18  24  37  64 130 160 190 218
 212 181 155 124  48  25  13   8   7  14  25  49 126 152 183 213
 209 176 151 120  32  17   5   2   3   4  16  35 122 148 177 210
 211 178 150 123  36  20   9   0   1  11  21  39 121 149 179 208
 214 180 153 125  46  30  15   6  10  12  27  50 127 154 182 215
 216 188 162 128  65  33  28  23  22  31  41  66 129 163 191 219
 224 193 166 139  92  55  47  40  42  44  54  95 136 164 194 226
 230 200 174 140 110  75  60  58  59  61  72 111 143 175 202 229
 241 221 186 146 118  88  77  68  69  79  89 119 147 187 222 240
 247 236 205 168 134 105  87  81  83  84 107 135 171 204 238 244
 254 250 235 198 157 115 101  98  96 100 114 159 199 232 251 255]
   0 1 255 {2 copy get Thresholds 3 -1 roll put} for
end
sethalftone
```

If the desired dot shape is simple enough to be reduced to a mathematical function, it is also possible to specify this directly to the PostScript printer. For instance, the standard circular dot $f(x,y)=\sqrt{(x^2+y^2)}$ can be created as follows:

150 0 {dup mul exch dup mul add sqrt} setscreen

This will create a 150 lpi screen at an angle of zero degrees.

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents. All cited patent documents and publications in the above description are incorporated herein by reference.

What is claimed is:

1. A method of preparing a halftone screen prior to printing a halftone image comprising the steps of:
   (a) receiving information representing tone variation in a previously recorded image;
   (b) processing the information to create a halftone screen representing tone variation in the image, by
      (i) creating printing areas in light tones to form dots having inwardly curved edges, and
      (ii) elongating and enlarging the dots with darkening tone; and
   (c) producing a halftone screen in a form appropriate for subsequent printing of a halftone image representing the previously recorded image.

2. A method according to claim 1, further comprising the step of:
   (b) (iii) joining the dots in a first stage as tone darkens to create linear printing areas having inwardly curved edges.

3. A method according to claim 2, further comprising the step of:
   (b) (iv) joining the linear printing areas in a second stage as tone darkens to create non-printing dots having outwardly curved edges.

4. A method according to claim 1, further comprising the step of:
   creating the dots to have inward curves on substantially every edge.

5. A method according to claim 1, further comprising the step of:
   elongating the dots along respective planes of substantially mirror symmetry.

6. A method of preparing a halftone screen prior to printing a halftone image comprising the steps of
   (a) receiving information representing tone variation in a previously recorded image;
   (b) processing the information to create a halftone screen representing tone variation in the image, by
      (i) creating non-printing areas in dark tones to form dots having outwardly curved edges, and
      (ii) elongating and enlarging the non-printing areas with lightening tone; and
   (c) producing the halftone screen in a form appropriate for subsequent printing of a halftone image representing the previously recorded image.

7. A method according to claim 6, further comprising the step of:
   (b) (iii) joining the dots in a first stage as tone lightens to create linear non-printing areas having outwardly curved edges.

8. A method according to claim 7, further comprising the step of:
   (b) (iv) joining the linear non-printing areas in a second stage as tone darkens to create printing dots having inwardly curved edges.

9. A method according to claim 6, further comprising the step of:
   creating the dots having outward curves along substantially every edge.

10. A method according to claim 6, further comprising the step of:
    elongating the dots along respective planes of substantially mirror symmetry.

11. Computer controlled apparatus which prepares halftone screens to be printed in halftone images comprising:
   (a) means for receiving information representing tone variation in previously recorded images;
   (b) means for processing the information to create halftone screens representing tone variation in the previously recorded images; and
   (c) means for producing the halftone screens in a form appropriate for subsequent printing of the halftone images representing the previously recorded images;
wherein the means for processing includes means for producing tone variation in the screens by creating printing areas which te light tones have inwardly curved edges and which form discrete dots having an increasing elongation with darkening tone.

12. Apparatus according to claim 11, wherein the means for processing further includes means for joining the dots in two distinct stages as tone darkens.

13. Apparatus according to claim 12 wherein the means for processing further includes means for placing primary color screens angularly at multiples of substantially 45° to one another.

14. Apparatus according to claim 11, further comprising:
   means for printing the halftone screens on an output medium.

15. Computer controlled apparatus which prepares halftone screens to be printed in halftone images comprising:
   (a) means for receiving information representing tone variation in previously recorded images;
   (b) means for processing the information to create halftone screens representing tone variation in the previously recorded images; and
   (c) means for producing the halftone screens in a form appropriate for subsequent printing of the halftone images;
wherein the means for processing includes means for producing tone variation in the screens by creating non-printing areas which in dark tones have outwardly curved edges and which form discrete dots of increasing elongation with lightening tone.

16. Apparatus according to claim 15, wherein the means for processing further includes means for joining the dots in two distinct stages as tone lightens.

17. Apparatus according to claim 15, wherein the means for processing further includes means for placing primary color screens angularly at multiples of substantially 45° to one another.

18. Apparatus according to claim 15, further comprising:
   means for printing the halftone screens on an output medium.

* * * * *